United States Patent [19]
Subramaniam et al.

[11] Patent Number: 6,113,795
[45] Date of Patent: Sep. 5, 2000

[54] PROCESS AND APPARATUS FOR SIZE SELECTIVE SEPARATION OF MICRO- AND NANO-PARTICLES

[75] Inventors: Bala Subramaniam; Roger A. Rajewski, both of Lawrence, Kans.; David J. Bochniak, Norwalk, Conn.

[73] Assignee: The University of Kansas, Lawrence, Kans.

[21] Appl. No.: 09/193,660

[22] Filed: Nov. 17, 1998

[51] Int. Cl.[7] .................................................. B01D 61/00
[52] U.S. Cl. ....................... 210/651; 210/650; 210/653; 210/805; 23/295 R
[58] Field of Search .................................. 210/650, 651, 210/652, 638, 634, 636, 653, 805; 23/295 R; 424/9.3, 45

[56] References Cited

U.S. PATENT DOCUMENTS

| | | | |
|---|---|---|---|
| 4,958,529 | 9/1990 | Vestal | 73/864.81 |
| 5,160,044 | 11/1992 | Tan | 210/652 |
| 5,430,224 | 7/1995 | Schucker | 210/644 |
| 5,527,466 | 6/1996 | Li et al. | 210/636 |
| 5,639,441 | 6/1997 | Sievers et al. | 424/9.3 |
| 5,864,923 | 2/1999 | Rouanet et al. | 23/295 R |
| 5,961,835 | 10/1999 | Sarrade et al. | 210/652 |
| 5,981,474 | 9/1999 | Manning et al. | 514/2 |

FOREIGN PATENT DOCUMENTS 2190398  11/1987  United Kingdom.

*Primary Examiner*—Ana Fortuna
*Attorney, Agent, or Firm*—Hovey, Williams, Timmons & Collins

[57] ABSTRACT

Processes and apparatuses are provided for continuously harvesting particles from organic solution-laden near-critical and supercritical fluids. Broadly, the processes and apparatuses utilize a filter or separator comprising a thin membrane supported on a sintered stainless steel tube. A feed stream comprising the desired particles, a supercritical antisolvent for the particles (preferably $CO_2$), and a solvent for the particles, is contacted with the membrane layer of the filter under supercritical conditions for the mixture of antisolvent and solvent. The preferred antisolvents are substantially miscible with the solvent and have a critical temperature of less than 160° C. The desired particles are retained by the filter while the solvent and most of the antisolvent pass through the filter, resulting in separation of the particles from the solvent.

72 Claims, 3 Drawing Sheets

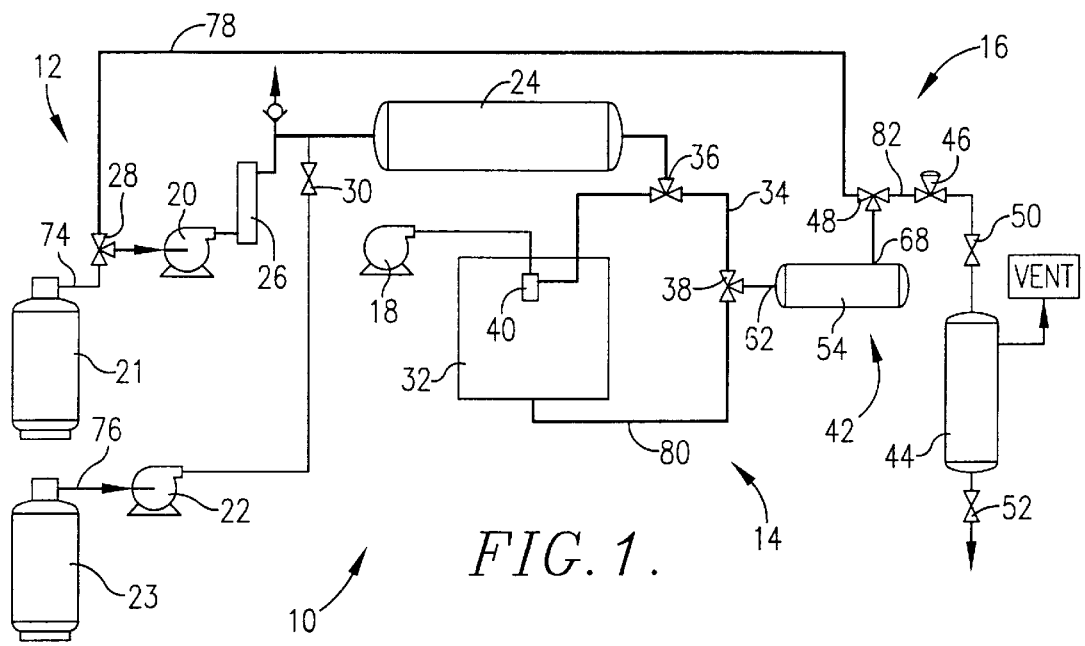
FIG.1.
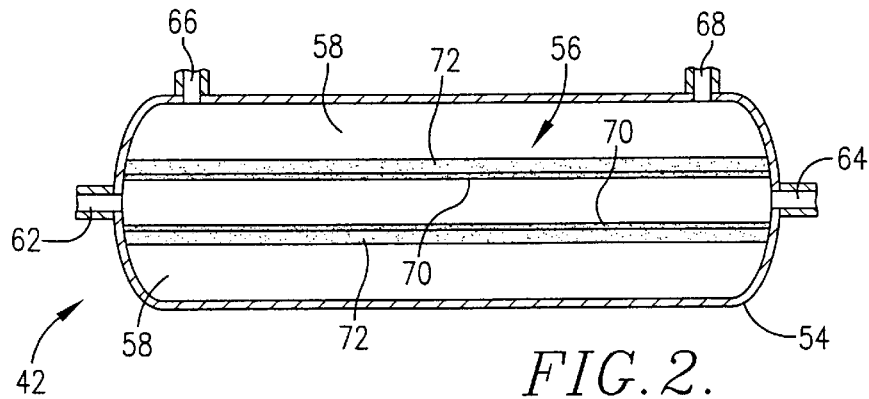
FIG.2.
FIG.3.
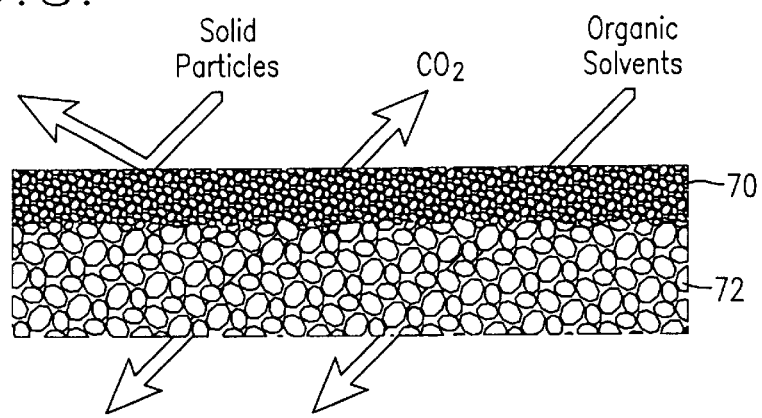

PROCESS AND APPARATUS FOR SIZE SELECTIVE SEPARATION OF MICRO- AND NANO-PARTICLES

BACKGROUND OF THE INVENTION

1. Field of the Invention

The present invention is broadly concerned with processes and apparatuses for continuously harvesting micro- and nano-particles from organic solution-laden supercritical fluids. More particularly, the invention pertains to separators or filters comprising porous membranes preferably formed of $TiO_2$ supported on porous metal substrates such as porous, sintered stainless steel. A feed stream comprising the desired particles, a supercritical antisolvent for the particles (preferably $CO_2$) and a solvent for the particles is contacted with the membrane layer of the filter under near-critical or supercritical conditions for the mixture of antisolvent and solvent. The desired particles are retained by the filter while the solvent and most of the antisolvent pass through the filter. In one embodiment, the processes and apparatuses are combined with the Precipitation with Compressed Antisolvents (PCA) processes. In another embodiment, a plurality of filters is utilized in parallel, thus providing continuous harvesting of the desired particles.

2. Description of the Prior Art

For pharmaceutical applications, $CO_2$ is an ideal processing medium. Because of its relatively mild critical temperature (31.1° C.), it is possible to exploit the advantages of near-critical operation at temperatures lower than 35° C. Furthermore, $CO_2$ is non-toxic, non-flammable, relatively inexpensive, recyclable, and "generally regarded as safe" by the FDA and pharmaceutical industry. Even though the critical pressure (73.8 bar or 1070 psi) of $CO_2$ is relatively high, such operating pressures and equipment are fairly routine in large-scale separation processes involving supercritical $CO_2$, such as the decaffeination of coffee beans and the extraction of hops.

Carbon dioxide is a non-polar solvent. As such, carbon dioxide is essentially a nonsolvent for many lipophilic and hydrophilic compounds (which covers most pharmaceutical compounds). Supercritical $CO_2$ has been exploited both as a solvent and as a nonsolvent or antisolvent in pharmaceutical applications. The ability to rapidly vary the solvent strength, and thereby the rate of supersaturation and nucleation of dissolved compounds, is a unique aspect of supercritical technology for particle formation.

The relatively low solubilities of pharmaceutical compounds in unmodified carbon dioxide are exploited in the $CO_2$-based antisolvent processes wherein the solute of interest (typically a drug, polymer or both) is dissolved in a conventional solvent to form a solution. The preferred ternary phase behavior is such that the solute is virtually insoluble in dense carbon dioxide while the solvent is completely miscible with dense carbon dioxide at the precipitation temperature and pressure.

The solute is recrystallized from solution in one of two ways. In the first method, a batch of the solution is expanded several-fold by mixing with dense carbon dioxide in a vessel. Because the carbon dioxide-expanded solvent has a lower solvent strength than the pure solvent, the mixture becomes supersaturated forcing the solute to precipitate or crystallize as micro-particles. This process is generally referred to as Gas Antisolvent (GAS) precipitation (Gallagher et al., 1989 Gas Antisolvent Recrystallization: New Process to Recrystallize Compounds in Soluble and Supercritical Fluids. *Am. Chem. Symp.* Ser., No. 406; U.S. Pat. No. 5,360,487 to Krukonis et al.; U.S. Pat. No. 5,389,263 to Gallagher et al.).

The second method involves spraying the solution through a nozzle into compressed carbon dioxide as fine droplets. This process is referred to as Precipitation with Compressed Antisolvents (PCA) (Dixon et al., *AIChE J.*, 39:127–39(1993)) and employs either liquid or supercritical carbon dioxide as the antisolvent. When using a supercritical antisolvent, the spray process is referred to as Supercritical Antisolvent (SAS) Process (Yeo, *Biotech. Bioeng.*, 41:341–46 (1993)) or Aerosol Spray Extraction System (ASES) process (Müller et al., Verfahren zur Herstellung einer mindestens einen Wirkstoffund einen Träger umfassenden Zubereitung, German Patent Appl. No. DE 3744329 A1 1989.).

The foregoing references demonstrate that techniques using carbon dioxide as a nonsolvent can produce drug particles in a narrow size distribution using fewer organic solvents. Because the spray-processes (PCA, SAS and ASES) permit faster depletion of the solvent (and hence a greater production rate of particles) relative to the GAS process, they have received more attention in recent years.

The particles formed in the recrystallizer during a PCA process have to be recovered without significantly decreasing the pressure or temperature. Otherwise, the solvent would separate from the $CO_2$ phase and re-dissolve the particles. In laboratory proof-of-concept studies involving particle micronization, only microgram to a few milligram quantities of particles are formed by spraying for a few minutes. These particles are collected after spraying is stopped and the system is flushed with dense carbon dioxide for a sufficient period of time to reduce the solvent concentration to negligible proportions. The system pressure is then reduced to ambient pressure, and the particles are collected from the crystallizer. Clearly, this method of harvesting particles is not suited for continuous production of particles. Continuous particle production and harvesting is necessary in order to produce particles on the order of g/hr or on a larger commercial scale of kg/hr. Therefore, a process in which the solvent is continuously separated from the $CO_2$/solvent/particles mixture is desirable.

Cyclone separators have been employed to separate the particles from a stream containing the particles and solvent-loaded $CO_2$. In this method, the particles generated in the crystallization chamber are continuously separated in a downstream high-pressure cyclone separator. The effluent stream from the cyclone separator is led to a flash drum operated at decreased pressures where the solvent and the $CO_2$ phases are separated and recycled. Cyclone separators work best for separating particles 5 µm or greater and are generally not effective for separating submicron or nano-particles.

Electrostatic precipitation is another viable method to harvest nanoparticles. However, currently available electrostatic precipitators are rated up to only 10 bar (or about 738 psi). Hence, custom design and fabrication of an electrostatic precipitator for operation at supercritical conditions is needed. Another disadvantage of electrostatic precipitation is that the static charge tends to cause particle agglomeration.

SUMMARY OF THE INVENTION

The instant invention overcomes the above problems by providing processes and apparatuses for continuously harvesting micro-and nano-particles from near-critical or supercritical fluids. Broadly speaking, the processes and apparatuses of the invention utilize both cross-flow and dead-end filtration through porous filters (preferably membranes built on stainless steel substrates) to effect removal by differential concentration gradients of organic solvents from near-critical or supercritical feed streams while physically separating entrained micro-and nano-particles.

In more detail, the processes of the invention comprise introducing a feed stream which comprises the desired particles and a mixture including a solvent for the particles and an antisolvent for the particles into a separator or filter (herein, "filter" and "separator" are used interchangeably) so that at least a portion of the mixture passes through the separator while at least a portion of the particles are retained by the separator. The introduction of the feed stream into the separator is preferably carried out at supercritical conditions for the mixture to assist in minimizing or preventing the particles from redissolving in the solvent prior to their separation and collection.

In both the processes and apparatuses of the invention, the antisolvent utilized should be a supercritical fluid having a critical temperature of less than about 160° C., preferably less than about 100° C., and more preferably from about 30–50° C. Any antisolvent for the particles which is also substantially miscible with the solvent (typically an organic solvent in pharmaceutical applications) for the particles is suitable. Preferred antisolvents include those selected from the group consisting of $CO_2$, propane, butane, isobutane, nitrous oxide, sulfur hexafluoride, trifluoromethane, methane, hydrogen, and mixtures thereof, with $CO_2$ being particularly preferred.

The preferred separator comprises first and second porous layers. It is preferred that the first layer comprise a membrane having a thickness of from about 0.5 $\mu$m to about 40 $\mu$m, and preferably from about 1 $\mu$m to about 10 $\mu$m, and that the membrane be formed of $TiO_2$. The second layer is preferably a porous metal such as sintered stainless steel. Preferably, the first layer is deposited on one of the surfaces of the second layer so that the strong, metal, second layer supports the thin first layer, allowing the separator to withstand pressures of at least about 1000 psi, and preferably at least about 5000 psi, without being destroyed. Thus, the separator utilized in the processes and apparatuses of the invention should be able to withstand conditions that are supercritical for the solvent/antisolvent mixture.

In embodiments where the first layer is formed as a membrane, the membrane preferably includes pores having an average pore size of from about 0.08–0.12 $\mu$m, and preferably about 0.1 $\mu$m. However, those skilled in the art will appreciate that the average pore size can be adjusted to suit the particular application. For example, the membranes can be selected for retaining particles having the following desired particle sizes: particles having an average size of less than about 0.5 $\mu$m for use in forming cancer treating agents or for use in intravenous injections; particles having an average size of from about 1–5 $\mu$m for use in inhalation therapy; and particles having an average size of from about 10–50 $\mu$m for applications where larger particles sizes are necessary.

Advantageously, the processes and apparatuses of the invention can be combined with the PCA methods described above to recover particles formed in the recrystallizer during the PCA process in a continuous, large-scale process. Thus, the feed stream can be formed by contacting a dispersion which includes the desired particles substantially dissolved in a solvent, with the antisolvent so that at least a portion of the solute is crystallized from the dispersion. This contacting can be carried out through use of a nozzle such as the one described in U.S. Pat. No. 5,833,891, incorporated by reference herein.

The processes and the apparatuses of the invention can be used to achieve an increased rate of production and harvesting. Because the processes can be carried out continuously by using two or more separators in parallel, the quantity of particles collected in accordance with the invention will be at least about $1.0 \times 10^{-3}$ kg/hr per square meter of membrane surface area, and preferably at least about $2.5 \times 10^{-2}$ kg/hr per square meter of membrane surface area, where the membrane surface area is defined by the nominal surface area determined using the cross-section area of the interior of the membrane rather than the internal surface area of the pores of the membrane layer. It is a particularly important feature of the invention that no chemical reactions take place during practice of the instant invention, thus resulting in particles which are the same chemically as the drug used to form the dispersion.

BRIEF DESCRIPTION OF THE DRAWINGS

FIG. 1 is a schematic illustration of a $CO_2$-based particle recovery system (shown in recycle mode) which can be operated either with or without recycle of the effluent ($CO_2$/solvent) stream from the separator in accordance with the instant invention;

FIG. 2 is a schematic depiction of the high pressure filter containing a porous membrane on a sintered stainless steel filter tube;

FIG. 3 schematically depicts the process by which the solid particles are separated from the supercritical $CO_2$/solvent stream;

DETAILED DESCRIPTION OF THE PREFERRED EMBODIMENTS

Figure 4:
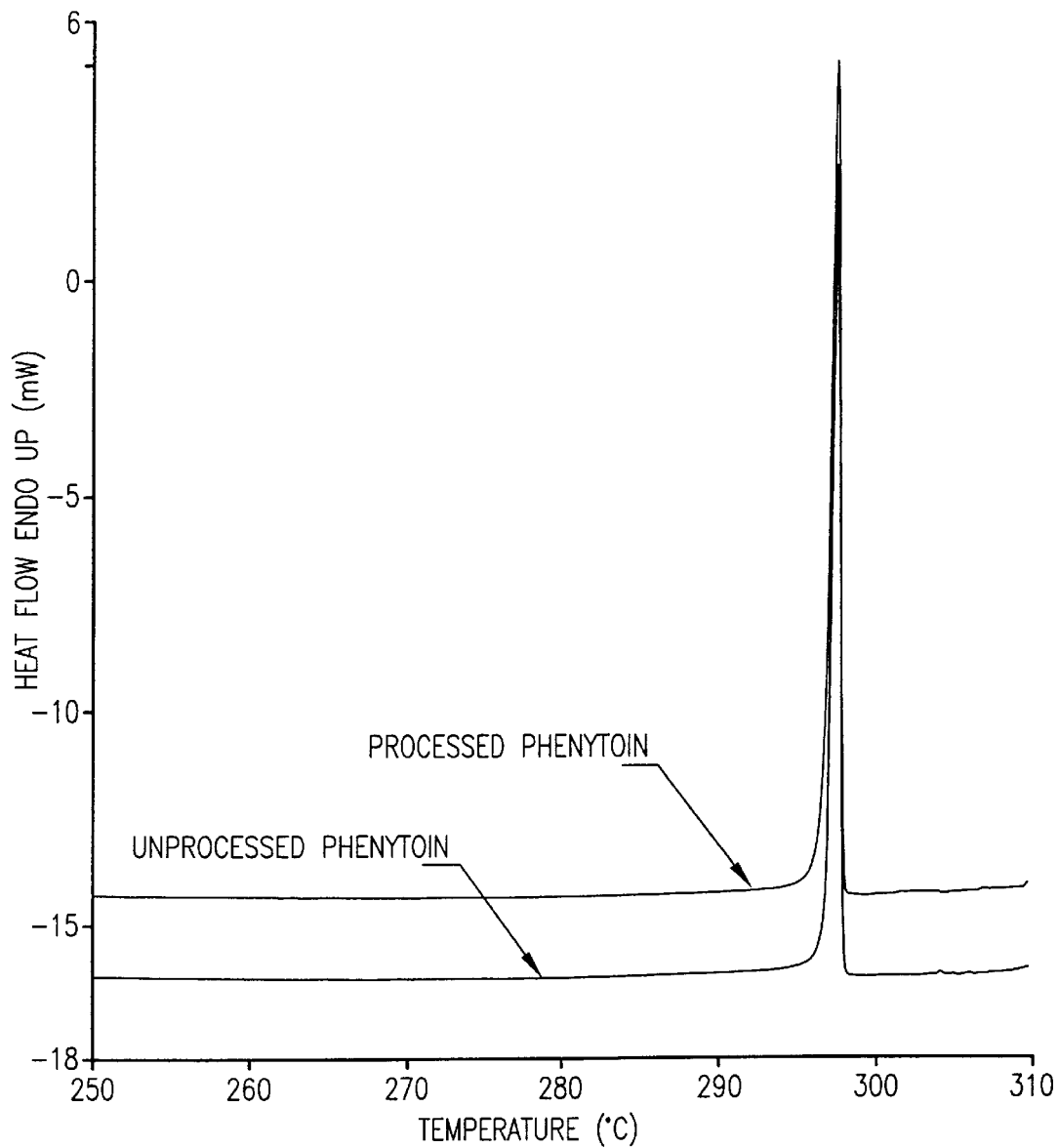
FIG. 4 is a graph showing a differential scanning calorimeter (DSC) thermogram of phenytoin following PCA reprecipitation and harvesting of the particles compared to the DSC thermogram of phenytoin prior to dissolution in PCA process solvent.

A particle recovery system 10 in accordance with the invention is schematically depicted in FIG. 1. Broadly, system 10 includes a feed section 12, a precipitation unit 14, and a particle separation section 16.

In more detail, section 12 includes a drug solution syringe pump 18, carbon dioxide pumps 20, 22, and a manifold system (not shown) for switching between supply cylinders 21, 23 for pumps 20, 22, respectively. Section 12 further comprises a 2.25 liter surge tank 24, a $CO_2$ flowmeter 26, and valves 28, 30.

Unit 14 includes an 8.3 liter recrystallization chamber 32, bypass line 34, and bypass valves 36, 38. Chamber 32 is equipped with a nozzle 40 (preferably an ultrasonic nozzle) and has two circular viewing windows offset at 90° for observing spray pattern and particle formation. A pressure transducer (not shown) is connected to chamber 32.

Section 16 includes a particle separation vessel 42, a solvent collection vessel 44, pressure-reducing valve 46, and valves 48, 50, 52. Valve 46 is a stepping-motor controlled, micrometering valve (such as Model No. 30VRMM-4812 from Autoclave Engineers) which regulates the pressure in chamber 32. Valve 46 is wrapped with heaters (OMEGA, OMEGALUX) to counteract the cooling associated with the expansion of $CO_2$.

Vessel 42 includes a housing 54 with a cylindrical separator or filter 56 positioned within housing 54 as schematically shown in FIG. 2. Housing 54 defines a chamber 58. When operating in the membrane mode, vessel 42 includes feed stream inlet 62, feed stream outlet 64, concentration gradient-forming stream inlet 66, and concentration gradient-forming stream outlet 68 (see FIG. 2). When operating in the recycle mode, vessel 42 includes inlet 62 and outlet 68, but not inlet 66 and outlet 64 (see FIG. 1). Tank 24, recrystallization chamber 32, and vessel 42 are located in a water bath and maintained at a constant temperature by an immersion circulator. Thermocouple probes (not shown) are placed in the bath and in recrystallization chamber 32 to monitor the process temperatures.

Filter 56 comprises a porous membrane 70 (preferably formed of $TiO_2$) applied to the inner surface of a sintered stainless steel tube 72 (see FIGS. 2 and 3), thus forming a smooth, foulant-resistant membrane with a typical pore size of about 0.1 μm which separates submicron particles. Membrane 70 is extremely thin, having a thickness of about 40 microns or less. Filter 56 is the type of membrane filter system typically used in the pharmaceutical and biotechnology industries in applications such as fermentation broth concentration and clarification, protein separation and recovery, and starch filtration. While any porous membrane on stainless steel filter which has been labeled pharmaceutically acceptable is suitable for use in the instant invention, a particularly preferred filter for use as filter 56 is the SCEPTER™ available from Graver Separations.

The remaining equipment discussed above which comprises particle recovery system 10 is conventional and can be selected by those skilled in the art. Table 1 sets forth some of the preferred equipment.

TABLE 1

Preferred Equipment

| EQUIPMENT | PREFERRED MODELS |
|---|---|
| Drug solution pump 18 | Model No. 2600, ISCO |
| $CO_2$ pump 20 | AGD-7, Haskel |
| $CO_2$ pump 22 | BBB-4, Eldex |
| Surge tank 24 | Whitey sample cylinder |
| Flowmeter 26 | OMEGA, FL-2102 |
| Nozzle 40 | The nozzle disclosed in U.S. Pat. No. 5,833,891 |
| Pressure Transducer | DP-15, Validyne |
| Immersion Circulator | Model 70, Fisher Scientific |

In operation, flowing carbon dioxide is flowed to the precipitation chamber 32 until the pressure within the chamber reaches a predetermined level which is selected based upon the critical temperature of the antisolvent, as discussed previously. For purposes of explanation only, the antisolvent utilized is $CO_2$, the preferred antisolvent. During operation, the $CO_2$ from cylinder 23 is cooled continuously to ensure that it is a liquid at pump 22. When the pressure is near the desired level, valve 46 is engaged to maintain that pressure. The exit lines 74, 76 from cylinders 21, 23 respectively, can be combined and directed to tank 24 together, with flowmeter 26 measuring the flow rate of $CO_2$ from cylinder 21. Alternately, valve 28 can be adjusted so that the $CO_2$ flows through pump 20, and then to flowmeter 26.

When the pressure and temperature within chamber 32 are stabilized, the drug-containing solution (i.e., the desired drug dissolved in a solvent) is introduced via pump 18 into chamber 32 through the inner tube (which has an inner diameter of about 0.152 mm) of nozzle 40. Supercritical $CO_2$ is simultaneously flowed through the annulus of the nozzle (i.e., the converging-diverging section with an effective throat opening of 0.165 mm), dispersing the drug solution into tiny droplets. The supercritical carbon dioxide functions as an antisolvent for the drug, selectively extracting the solvent from the spray droplets, thereby causing the drug to precipitate as small particles in the high-pressure chamber.

The supercritical effluent from chamber 32 is then transported and fed to the high pressure separation vessel 42 via line 80. Referring to FIG. 2, the feed stream (which contains the solvent, $CO_2$, and drug particles) enters through inlet 62 and into filter 56. Pure $CO_2$ (or other fluid or gas which is free of the organic solvent, such as such as pure helium or nitrogen) simultaneously enters through inlet 66 into chamber 58. Because the stream within chamber 58 (and thus outside filter 56) does not contain any solvent, a concentration gradient is created, thus causing the solvent within the feed stream to diffuse through membrane 70 and tube 72 and to be carried out of chamber 58, through outlet 68. As best shown in FIG. 3, the solid drug particles within the feed stream do not pass though membrane 70 and tube 72, thus allowing collection of those particles. The $CO_2$/solvent stream that exits outlet 68 is then transported to collection vessel 44 via line 82 for condensation and collection of the solvent. The $CO_2$ is vented from vessel 44 while the solvent can be released from vessel 44 by valve 52 and recycled, if desired. Or, the solvent-laden $CO_2$ can also be recycled from vessel 42 back to pump 20 through line 78 and valve 28. Alternately, a solvent separation unit similar to vessel 44 may be incorporated in line 78 such that the separated $CO_2$ is recycled back to pump 20 and then to chamber 32.

The pressures within both chamber 32 and vessel 42 are preferably the same, so that pressure drops are avoided. This pressure should be from about 0.5 $P_C$ to about 2 $P_C$, preferably from about 1.1 $P_C$ to about 1.3 $P_C$, where $P_C$ is the critical pressure of the $CO_2$/solvent mixture. When using $CO_2$, this will generally equal a pressure of from about 1000–2000 psi, and preferably from about 1100–1300 psi. Should the pressures drop below these levels, the drug particles will dissolve back into the solvent, thus minimizing or even preventing particle recovery. Therefore, the pressure within vessel 42 should be within about 50 psi, and preferably within from about 5–10 psi, of the pressure within chamber 32 during the formation of the particles/$CO_2$/solvent dispersion.

The temperature within vessel 42 is preferably from about 0.5 $T_C$ to about 1.5 $T_C$, and more preferably from about 0.9 $T_C$ to about 1.1 $T_C$, wherein $T_C$ is the critical temperature of the $CO_2$/solvent mixture. When using $CO_2$, this will generally equal a temperature 10–50° C.

In another embodiment, pure $CO_2$ is metered through outlet 68 simultaneous to the metering of the feed stream, but in a direction that is counter-current to the direction of the feed stream through inlet 62. Thus, the pure $CO_2$ is introduced into chamber 58 through outlet 68, and the $CO_2$/solvent stream exits the chamber by way of inlet 66. This counter-current mode is particularly advantageous for maximizing the concentration driving force for separation of the solvent from the drug particles.

In another embodiment, the feed stream is introduced into filter 56 without pure $CO_2$ being fed into chamber 58. As described above, the particles will not pass through membrane 70 and tube 72 of filter 56. However, with sufficient residence time in vessel 42, the $CO_2$ and solvent will pass through and then exit chamber 58 through outlet 68.

In another embodiment, a conventional filter (not shown) is placed immediately downstream of outlet 64. The pores of the filter should have a size of about 0.5 $\mu$m in order to prevent submicron drug particles from exiting the filter 56.

In another embodiment, outlet 64 is capped and the feed stream is introduced through inlet 62 into filter 56 without pure $CO_2$ (or other antisolvent) being fed into chamber 58. This forces membrane 70 to act as a high surface area filter, rather than preventing particles from passing through membrane 70, retaining particles while allowing solvent and $CO_2$ to pass through membrane 70 and tube 72, exiting the chamber through outlet 68.

In yet another embodiment, nozzle 40 (and the spray from nozzle 40) are placed within vessel 42, and more preferably within filter 56, rather than within chamber 32.

Regardless of which embodiment is utilized, once the drug solution flow is halted, $CO_2$ flow is preferably continued through the system in order to flush any solvent remaining in the chamber 32. The $CO_2$ from chamber 32 can then be used to flush any remaining solvent from vessel 42. Alternately, bypass valves 36 and 38 can be adjusted so that $CO_2$ is fed directly from tank 24 through bypass line 34 and into vessel 42, thus saving significant flushing time and $CO_2$. The particles are then collected from the $CO_2$ stream by dropping the pressure resulting in the separation of the particles from the stream. Optionally, for larger particles (such as those having a size greater than 1 $\mu$m) the stream can be directed to a cyclone separator.

Advantageously, each of the methods and apparatuses of the invention can be configured to provide for continuous harvesting of drug particles. This can be accomplished by utilizing several vessels 42 in parallel. In this embodiment, when filter 56 of a first vessel 42 is filled with drug particles, the flow of particles/$CO_2$/solvent from chamber 32 is diverted to a second, parallel vessel 42. While second vessel 42 is filled with particles, the first vessel 42 is flushed with $CO_2$ to remove residual solvent traces from filter 56. First vessel 42 then resumes harvesting particles while second vessel 42 is flushed with $CO_2$, and so on. This can be carried out with several vessels 42, so that particles are continuously being formed within chamber 32.

EXAMPLES

The following examples set forth preferred methods in accordance with the invention. It is to be understood, however, that these examples are provided by way of illustration and nothing therein should be taken as a limitation upon the overall scope of the invention.

Analysis of Results

The results from each of the following Examples were analyzed as described herein. Particles were harvested as described and weighed. Particles were analyzed with both an optical microscope and a particle size analyzer. Optical microscope results showed particles collected from the membrane for most runs had unimodal populations while particles collected from the chamber had a bimodal distribution, which is attributed to different flow patterns and longer residence time within the precipitation chamber. The optical microscope observations were supported by the results of the AEROSIZER dry particle size analyzer, which used time-of-flight data to determine particle size. In each of the following tables, the mean particle sizes are taken from the differential number versus diameter analyses performed by the AEROSIZER analyzer.

Example 1

This test was carried out to demonstrate that solvent can be removed from a supercritical antisolvent by creating a concentration gradient across the filter. The procedure followed was as described above using the apparatus illustrated in the figures, with the following noted: $CO_2$ and the solvent were pumped to nozzle 40; fresh $CO_2$ was pumped to chamber 58 via inlet 66 (see FIG. 2); and the amount of solvent exiting from each of outlets 68 and 64 was measured. The amount of solvent separated by the membrane depended upon the flow rates and residence times of the streams through each side of the membrane. Solvent recovery efficiencies ranging from about 9–100% were realized at different operating conditions. The run conditions and results are shown in Table 2.

TABLE 2

Continuous Processing Without $CO_2$ Recycle (Membrane Mode)

| Run # | Temp[a] (°C.) | Press.[a] (psi) | Nozzle[b] ΔP (psi) | $CO_2$ flow rate (g/min)[c] | Conc[d] (mg/mL) | Mean Particle Size ($\mu$m) chamber | Mean Particle Size ($\mu$m) membrane |
|---|---|---|---|---|---|---|---|
| 1 | 37.9 | 1194 | NA[e] | 132–173 | 10.0 | NA[e] | NA[e] |
| 2 | 39.5 | 1181 | 18.7 | 248 | 10.0 | 1.10 | 1.00 |

[a]Temperatures and pressures were the same in the chamber 32 and vessel 42.
[b]Pressure drop between inlet and outlet of nozzle.
[c]Grams per minute.
[d]Concentration of solute in solution or dispersion spray.
[e]Not available.

Example 2

This test was carried out to demonstrate particle separation and collection without recycling the solvent or $CO_2$. The procedure followed was as described above with the following noted: inlet 66 was capped; outlet 64 was capped; the feed stream included particles of phenytoin; and the effluent stream from vessel 42 was sent to vessel 44 where the $CO_2$ was vented from the solvent. The operating conditions and results are set forth in Table 3.

TABLE 3

Continuous Processing Without $CO_2$ Recycle (Filter Mode)

| Run # | Temp[a] (°C.) | Press.[a] (psi) | Nozzle[b] ΔP (psi) | $CO_2$ flow rate (g/min)[c] | Conc[d] (mg/mL) | Mean Particle Size (μm) chamber | membrane |
|---|---|---|---|---|---|---|---|
| 1 | 40.8 | 1204 | 13.9 | 132–144 | 10.0 | 1.86 | 0.78 |
| 2 | 40.5 | 1203 | 8.8 | 121–143 | 10.0 | 1.02 | 1.02 |
| 3 | 38.2 | 1194 | 10.3 | 114–181 | 10.0 | 1.12 | 1.18 |
| 4 | 38.3 | 1098 | 8.0 | 80–107 | 10.0 | 0.98 | 1.02 |
| 5 | 36.7 | 1196 | 12.1 | 80–248 | 10.0 | 1.12 | 1.29 |

[a]Temperatures and pressures were the same in the chamber 32 and vessel 42.
[b]Pressure drop between inlet and outlet of nozzle.
[c]Grams per minute.
[d]Concentration of solute in solution or dispersion spray.

Example 3

In this test, system 10 was configured to operate in the recycle mode (i.e., the effluent stream from vessel 42 was recycled back to chamber 32). To reduce the residence times of precipitated phenytoin (anti-convulsant drug) particles in chamber 32, the system was operated with high $CO_2$ flow rates (roughly 0.5 kg/min) through the nozzle 40. High flow rates through the ultrasonic nozzle facilitate the finer breakup of the solution spray droplets and thereby favor the production of smaller particles.

$CO_2$ from the supply cylinder filled chamber 32, surge tank 24, and recycle lines of the system to the desired operating pressure and temperature. Once pressure control was achieved at the set pressure, the position of valve 46 was maintained, and the valves were switched to recycle the $CO_2$/solvent stream flow. When stable operation (i.e., steady pressure and temperature during recirculating flow) was established, $CO_2$ was pumped through the system by means of pump 20. The $CO_2$ flow rate was varied by adjusting the pressure of the air supply to the pump. The stream exiting pump 20 passed through tank 24 in order to dampen flow pulsations, and entered chamber 32 through nozzle 40. The drug solution (phenytoin and acetone) was also sprayed into chamber 32 via nozzle 40. The effluent from chamber 32 flowed through filter 56 of vessel 42 (to retain the particles) and was then redirected to pump 20, thus completing the recycle circuit. The drug particles formed in the chamber 32 were filtered in vessel 42, which allowed the solvent and $CO_2$ to circulate. The operating conditions (P and T) were chosen such that the acetone and $CO_2$ were infinitely miscible. Thus, the formation of a solvent phase that would redissolve the drug particles was avoided. The operating conditions for this series of test runs are set forth with the test results in Table 4.

When an adequate amount of particles was collected, the drug solution spray was stopped. The three-way valves were switched, and fresh $CO_2$ was admitted to the chamber. The fresh $CO_2$ was used to flush the acetone from the system. This was done for at least 60 minutes after each run. Once the system was free of solvent, the pressure was dropped to recover the drug particles from the precipitation chamber and membrane.

TABLE 4

Continuous Precipitation with $CO_2$ Recycle (Filter Mode)

| Run # | Temp[a] (°C.) | Press.[a] (psi) | Nozzle[b] ΔP (psi) | $CO_2$ flow rate (g/min)[c] | Conc[d] (mg/mL) | Mean Particle Size (μm) chamber | membrane |
|---|---|---|---|---|---|---|---|
| 1 | 37.7 | 1195 | 34.6 | 315 | 10.0 | Ins.[e] | 1.14 |
| 2 | 37.9 | 1190 | 39.2 | 419 | 10.0 | Ins.[e] | 1.16 |

[a]Temperatures and pressures were the same in the chamber 32 and vessel 42.
[b]Pressure drop between inlet and outlet of nozzle.
[c]Grams per minute.
[d]Concentration of solute in solution or dispersion spray.
[e]Insufficient amount recovered for analysis.

Example 4

This test was carried out following the procedure described in Example 3 except that following cessation of solution spraying, bypass valves 36 and 38 were adjusted so that $CO_2$ was fed directly from tank 24 through bypass line 34 and into vessel 42, thus flushing filter 56 in a more efficient manner. In this embodiment, the volume needed to be flushed was only 100 mL as opposed to about 8 liters. The operating conditions and results are set forth in Table 5.

TABLE 5

Continuous Precipitation with $CO_2$ Recycle and Membrane Isolation Flushing
(Filter Mode)

| Run # | Temp[a] (°C.) | Press.[a] (psi) | Nozzle[b] ΔP (psi) | $CO_2$ flow rate (g/min)[c] | Conc[d] (mg/mL) | Mean Particle Size (μm) chamber | Mean Particle Size (μm) membrane |
|---|---|---|---|---|---|---|---|
| 1 | 37.2 | 1200 | NA[e] | 315 | 10.0 | 2.06 | 1.03 |
| 2 | 37.2 | 1200 | NA[e] | 419 | 5.0 | 1.53 | 1.02 |
| 3 | 37.6 | 1191 | 29.2 | 379 | 5.0 | Ins.[e] | 1.05 |
| 4 | 38.9 | 1188 | 25.8 | 419 | 10.0 | NA[f] | NA[f] |

[a]Temperatures and pressures were the same in the chamber 32 and vessel 42.
[b]Pressure drop between inlet and outlet of nozzle.
[c]Grams per minute.
[d]Concentration of solute in solution or dispersion spray.
[e]Insufficient amount recovered for analysis.
[f]Not available.

Example 5

Figure 5:
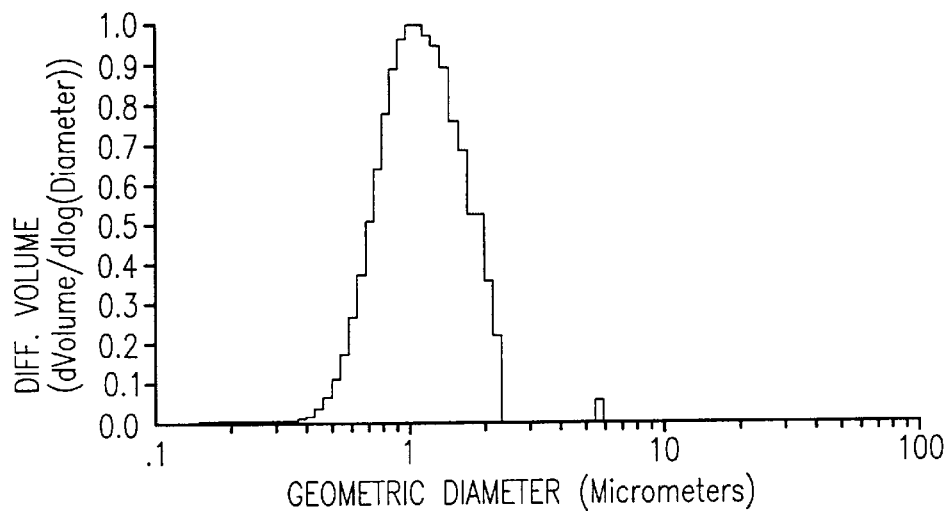
FIG. 5 is a graph illustrating the particle size distribution expressed in terms of the differential volume vs. the geometric diameter of phenytoin particles collected from the membrane in Example 2, Run No. 1.
Figure 6:
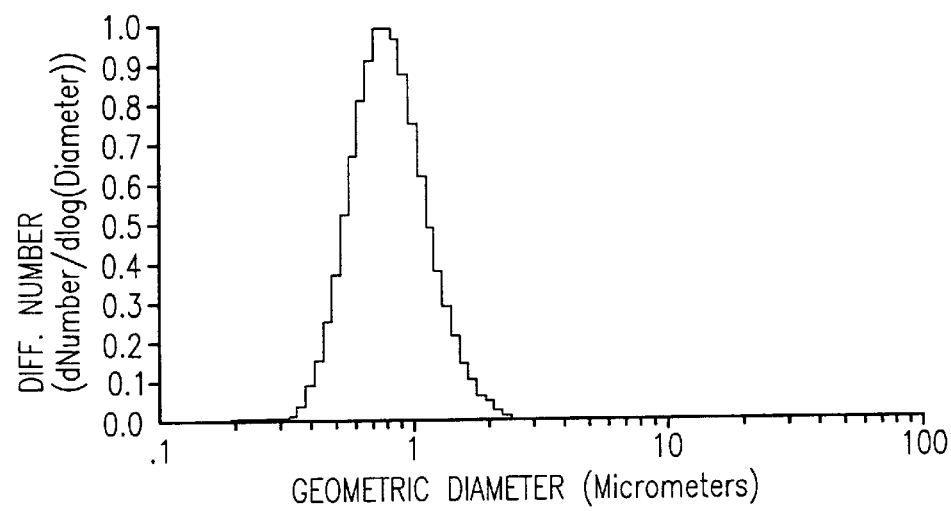
FIG. 6 is a graph illustrating the particle size distribution expressed in terms of the differential number vs. the geometric diameter of phenytoin particles collected from the membrane in Example 2, Run No. 1.

Particle size distribution of the particles harvested from the membrane in Example 2, Table 3, Run #1 were determined by an API Aerosizer dry particle size analyzer. Those results are shown in Tables 6 and 7 below and in the graphs of FIGS. 5 and 6.

TABLE 6

Particle Size Distribution, Differential Volume vs. Diameter

| PARAMETERS | | DISPERSER CONTROL | | % UNDER | SIZE | % UNDER | SIZE |
|---|---|---|---|---|---|---|---|
| Material | phenytoin | Disperser Type | AeroDisperser | 5 | 0.6272 | 55 | 1.185 |
| Density | 1.30 | Shear Force | Med | 10 | 0.7087 | 60 | 1.246 |
| Run Length (sec) | 285.8 | Feed rate | Med | 15 | 0.7711 | 65 | 1.312 |
| PMT Voltage (volts) | 1100.0 | | | 20 | 0.8254 | 70 | 1.383 |
| Laser Current (mA) | 43.0 | Deagglomeration | Normal | 25 | 0.8760 | 75 | 1.461 |
| Clock Freq. (MHz) | 40.0 | Pin Vibration | On | 30 | 0.9246 | 80 | 1.558 |
| Sum of channels | 257895 | | | 35 | 0.9732 | 85 | 1.665 |
| Lower Size Limit | 0.10 | | | 40 | 1.023 | 90 | 1.815 |
| Upper Size Limit | 200.00 | | | 45 | 1.075 | 95 | 1.993 |
| Nozzle Type | 700 μm | SCANS 31 AND 32 | COMBINED | 50 | 1.128 | | |
| Baseline Offset | 0.10 | BETWEEN 3.3 & | 3.3 MICRONS | | | | |
| Noise Filter | 6.00 | | | | | | |
| Mean Size | 1.130 | D(4,3) | 1.211 | Mode (Log Scale) | 1.09 | | |
| Standard Deviation | 1.441 | D(3,2) | 1.059 | Spec surf area | 4.36 sq meter/g | | |

| UPPER SIZE | % IN | LOWER SIZE | % UNDER | UPPER SIZE | % IN | LOWER SIZE | % UNDER |
|---|---|---|---|---|---|---|---|
| 200 | 0.0000 | 176 | 100.00 | 29.9 | 0.0000 | 26.3 | 100.00 |
| 176 | 0.0000 | 155 | 100.00 | 26.3 | 0.0000 | 23.2 | 100.00 |
| 155 | 0.0000 | 137 | 100.00 | 23.2 | 0.0000 | 20.5 | 100.00 |
| 137 | 0.0000 | 120 | 100.00 | 20.5 | 0.0000 | 18.0 | 100.00 |
| 120 | 0.0000 | 106 | 100.00 | 18.0 | 0.0000 | 15.9 | 100.00 |
| 106 | 0.0000 | 93.5 | 100.00 | 15.9 | 0.0000 | 14.0 | 100.00 |
| 93.5 | 0.0000 | 82.4 | 100.00 | 14.0 | 0.0000 | 12.3 | 100.00 |
| 82.4 | 0.0000 | 72.6 | 100.00 | 12.3 | 0.0000 | 10.9 | 100.00 |
| 72.6 | 0.0000 | 64.0 | 100.00 | 10.9 | 0.0000 | 9.56 | 100.00 |
| 64.0 | 0.0000 | 56.3 | 100.00 | 9.56 | 0.0000 | 8.43 | 100.00 |
| 56.3 | 0.0000 | 49.6 | 100.00 | 8.43 | 0.0000 | 7.42 | 100.00 |
| 49.6 | 0.0000 | 43.7 | 100.00 | 7.42 | 0.0000 | 6.54 | 100.00 |
| 43.7 | 0.0000 | 38.5 | 100.00 | 6.54 | 0.0000 | 5.76 | 100.00 |
| 38.5 | 0.0000 | 33.9 | 100.00 | 5.76 | 0.4321 | 5.08 | 99.568 |
| 33.9 | 0.0000 | 29.9 | 100.00 | 5.08 | 0.0000 | 4.47 | 99.568 |
| 4.47 | 0.0000 | 3.94 | 99.568 | 0.67 | 3.9682 | 0.59 | 3.3197 |
| 3.94 | 0.0000 | 3.47 | 99.568 | 0.59 | 2.0391 | 0.52 | 1.2806 |
| 3.47 | 0.0000 | 3.06 | 99.568 | 0.52 | 0.8843 | 0.46 | 0.3964 |
| 3.06 | 0.0000 | 2.69 | 99.568 | 0.46 | 0.3043 | 0.40 | 0.0921 |
| 2.69 | 0.0000 | 2.37 | 99.568 | 0.40 | 0.0817 | 0.35 | 0.0104 |
| 2.37 | 3.3334 | 2.09 | 96.234 | 0.35 | 0.0104 | 0.31 | 0.0000 |
| 2.09 | 5.4399 | 1.84 | 90.795 | 0.31 | 0.0000 | 0.28 | 0.0000 |
| 1.84 | 7.5715 | 1.62 | 83.223 | 0.28 | 0.0000 | 0.24 | 0.0000 |
| 1.62 | 10.192 | 1.43 | 73.031 | 0.24 | 0.0000 | 0.21 | 0.0000 |
| 1.43 | 11.961 | 1.26 | 61.070 | 0.21 | 0.0000 | 0.19 | 0.0000 |
| 1.26 | 12.665 | 1.11 | 48.405 | 0.19 | 0.0000 | 0.17 | 0.0000 |
| 1.11 | 12.926 | 0.98 | 35.479 | 0.17 | 0.0000 | 0.15 | 0.0000 |

TABLE 6-continued

Particle Size Distribution, Differential Volume vs. Diameter

| | | | | | | | |
|---|---|---|---|---|---|---|---|
| 0.98 | 11.908 | 0.86 | 23.571 | 0.15 | 0.0000 | 0.13 | 0.0000 |
| 0.86 | 9.6010 | 0.76 | 13.970 | 0.13 | 0.0000 | 0.11 | 0.0000 |
| 0.76 | 6.6821 | 0.67 | 7.2879 | 0.11 | 0.0000 | 0.10 | 0.0000 |

TABLE 7

Particle Size Distribution, Differential Number vs. Diameter

| PARAMETERS | | DISPERSER CONTROL | | % UNDER | SIZE | % UNDER | SIZE |
|---|---|---|---|---|---|---|---|
| Material | phenytoin | Disperser Type | AeroDisperser | 5 | 0.4643 | 55 | 0.8032 |
| Density | 1.30 | Shear Force | Med | 10 | 0.5144 | 60 | 0.8382 |
| Run Length (sec) | 285.8 | Fe spraying step being carried out so that at least a portion of said solute precipitates out of said dispersion to form the particles;

introducing said feed stream into a separator having at least one porous layer at a pressure of from about 0.5 $P_C$ to about 2 $P_C$; and contacting said feed stream with said porous layer so that at least a portion of said dispersion passes through said layer and at least a portion of said particles are separated from the dispersion portion by said layer.

2. The process of claim 1, wherein said antisolvent has a critical temperature of less than about 160° C.

3. The process of claim 2, wherein said antisolvent is selected from the group consisting of $CO_2$, propane, butane, isobutane, nitrous oxide, sulfur hexafluoride, trifluoromethane, methane, hydrogen, and mixtures thereof.

4. The process of claim 3, wherein said antisolvent is $CO_2$.

5. The process of claim 1, wherein said introducing step is carried out under supercritical conditions for said mixture.

6. The process of claim 1, wherein said solvent is substantially miscible with said antisolvent at said pressure.

7. The process of claim 1, wherein said pressure is from about 1000–5000 psi.

8. The process of claim 1, wherein said solvent is an organic solvent.

9. The process of claim 1, wherein said separator comprises first and second porous layers and said first layer comprises a membrane having a thickness of from about 0.5 $\mu$m to about 40 $\mu$m.

10. The process of claim 9, wherein said membrane is formed of $TiO_2$.

11. The process of claim 10, wherein said second layer is formed of a porous, metal.

12. The process of claim 11, wherein said second layer is formed of sintered stainless steel.

13. The process of claim 9, wherein said first layer is in contact with said second layer.

14. The process of claim 10, wherein said feed stream is contacted with said first porous layer.

15. The process of claim 9, wherein said membrane includes pores having an average pore size such that a quantity of particles having a particle size of at least about 0.1 $\mu$m is separated from said mixture.

16. The process of claim 9, wherein said membrane includes pores having an average pore size such that a quantity of particles having a particle size of from about 1–5 $\mu$m is separated from said mixture.

17. The process of claim 9, wherein said membrane includes pores having an average pore size such that a quantity of particles having a particle size of from about 10–50 $\mu$m is separated from said mixture.

18. The process of claim 9, wherein said membrane includes pores having an average pore size of from about 0.08–0.12 $\mu$m.

19. The process of claim 9, wherein said introducing and contacting steps result in at least about $1.0 \times 10^{-3}$ kg of said particles separated from said mixture per hour per square meter of membrane surface area.

20. The process of claim 1, wherein said pressure during said introducing step is within 50 psi of the pressure during said forming step.

21. The process of claim 1, wherein said antisolvent has a critical temperature of less than about 160° C.

22. The process of claim 21 wherein said antisolvent is $CO_2$.

23. The process of claim 1, wherein no chemical reactions occur during said introducing and contacting steps.

24. The process of claim 1, wherein said feed stream is alternately introduced into a plurality of separators for continuously separating said particles.

25. The process of claim 1, wherein the temperature during said introducing step is from about 0.5 $T_C$ to about 1.5 $T_C$.

26. A process fro separating particles from a fluid comprising the steps of:

introducing a first feed stream into a separator having first and second porous layers at a pressure of from about 0.5 $P_C$ to about 2 $P_C$, said feed stream comprising said particles and a mixture including a solvent for said particles and an antisolvent for sail particles;

passing said first feed stream adjacent said first layer; and passing a second feed stream of an antisolvent free of said solvent adjacent said second layer so that a concentration gradient is created across said layers causing at least a portion of said solvent to cross said layers and pass with said second feed stream; wherein at least a portion of said particles are retained by said layers.

27. The process of claim 26, wherein said antisolvent has a critical temperature of less than about 160° C.

28. The process of claim 27, wherein said antisolvent is selected from the group consisting of $CO_2$, propane, butane, isobutane, nitrous oxide, sulfur hexafluoride, trifluoromethane, methane, hydrogen, and mixtures thereof.

29. The process of claim 28, wherein said antisolvent is $CO_2$.

30. The process of claim 26, wherein said introducing step is carried out under supercritical conditions for said mixture.

31. The process of claim 26, wherein said solvent is substantially, miscible with said antisolvent at said pressure.

32. The process of claim 26, wherein said pressure is from about 1000–5000 psi.

33. The process of claim 26, wherein said solvent is an organic solvent.

34. The process of claim 26, wherein said separator comprises first and second porous layers and said first layer comprises a membrane having a thickness of from about 0.5 $\mu$m to about 40 $\mu$m.

35. The process of claim 34, wherein said first layer is in contact with said second layer.

36. The process of claim 34, wherein said membrane includes pores having an average pore size such that a quantity of particles having a particle size of from about 1–5 $\mu$m is separated from said mixture.

37. The process of claim 34, wherein said membrane includes pores having an average pore size such that a quantity of particles having a particle size of from about 10–50 $\mu$m is separated from said mixture.

38. The process of claim 34, wherein said membrane includes pores having an average pore size of from about 0.08–0.12 $\mu$m.

39. The process of claim 34, wherein said introducing and contacting steps result in at least about $1.0 \times 10^{-3}$ kg of said particles separated from said mixture per hour per square meter of membrane surface area.

40. The process of claim 34, wherein said membrane is formed of $TiO_2$.

41. The process of claim 40, wherein said second layer is formed of a porous, metal.

42. The process of claim 41, wherein said second layer is formed of sintered stainless steel.

43. The process of claim 40, wherein said feed stream is contacted with said first porous layer.

44. The process of claim 34, wherein said membrane includes pores having an average pore size such that a quantity of particles having a particle size of at least about 0.1 μm is separated from said mixture.

45. The process of claim 26, further comprising the step of forming said feed stream prior to said introducing step, said forming step comprising contacting said antisolvent with a dispersion including a solute substantially dissolved in said solvent so that at least a portion of said solute precipitates out of said dispersion to form said particles.

46. The process of claim 45, wherein said pressure during said introducing step is within 50 psi of the pressure during said forming step.

47. The process of claim 45, wherein said antisolvent has a critical temperature of less than about 160° C.

48. The process of claim 47 wherein said antisolvent is $CO_2$.

49. The process of claim 45, wherein said introducing step is carried out under supercritical conditions for said mixture.

50. The process of claim 45, wherein said separator comprises first and second porous layers and said first layer comprises a membrane having a thickness of from about 0.5 μm to about 40 μm.

51. The process of claim 50, wherein said membrane is formed of $TiO_2$.

52. The process of claim 51, wherein said second layer is formed of sintered stainless steel.

53. The process of claim 51, wherein said feed stream is contacted with said first layer.

54. The process of claim 50, wherein said first layer in contact with said second layer.

55. The process of claim 50, wherein said membrane includes pores having an average pore size of from about 0.08–0.12 μm.

56. The process of claim 45, wherein said contacting is carried out by spraying said dispersion through a nozzle into said antisolvent, said antisolvent being supercritical.

57. The process of claim 26, wherein no chemical reactions occur during said introducing and contacting steps.

58. The process of claim 26, wherein said feed stream is alternately introduced into a plurality of separators for continuously separating said particles.

59. The process of claim 26, wherein the temperature during said introducing step is from about 0.5 $T_C$ to about 1.5 $T_C$ of the antisolvent.

60. A process for separating particles from a fluid comprising the steps of:
   introducing a feed stream into a separator having at least one porous layer at a pressure of from about 0.5 $P_C$ to about 2 $P_C$, said feed stream comprising said particles and a mixture including a solvent for said particles and an antisolvent for said particles;
   contacting said feed stream with said porous layer so that at least a portion of said mixture passes through said layer and at least a portion of said particles are separated from the mixture portion by said layer, said particles dispersed within a retentate fraction of the mixture; and
   subjecting the feed stream to a reduced pressure after said contacting step so that at least a portion of said particles are separated from said retentate fraction.

61. The process of claim 60, wherein said antisolvent has a critical temperature of less than about 160° C.

62. The process of claim 61, wherein said antisolvent comprises $CO_2$.

63. The process of claim 60, said contacting step being carried out at a temperature which is greater than the critical temperature of the antisolvent and less than the critical temperature of the solvent.

64. The process of claim 60, wherein said pressure is from about 1000–5000 psi.

65. A process for separating particles from a fluid comprising the steps of:
   introducing a feed stream into a separator having at least one porous layer at a pressure of from about 0.5 $P_C$ to about 2 $P_C$, said feed stream comprising said particles and a mixture including a solvent for said particles and an antisolvent for said particles; and
   contacting said feed stream with said porous layer so that at least a portion of said mixture passes through said layer and at least a portion of said particles are separated from the mixture portion by said layer, said introducing and contacting steps being carried out at a temperature which is greater than the critical temperature of the antisolvent and less than the critical temperature of the solvent.

66. The process of claim 65, wherein said antisolvent has a critical temperature of less than about 160° C.

67. The process of claim 66, wherein said antisolvent comprises $CO_2$.

68. The process of claim 65, wherein said pressure is from about 1000–5000 psi.

69. A process for separating particles from a fluid comprising the steps of:
   introducing a feed stream into a separator having at least one porous layer at a pressure of from about 0.5 $P_C$ to about 2 $P_C$, said feed stream comprising said particles and a mixture including a solvent for said particles and an antisolvent for said particles, said antisolvent being selected from the group consisting of $CO_2$, propane, butane, isobutane, nitrous oxide, sulfur hexafluoride, trifluoromethane, methane, hydrogen, and mixtures thereof, and
   contacting said feed stream with said porous layer so that at least a portion of said mixture passes through said layer and at least a portion of said particles are separated from the mixture portion by said layer, said introducing and contacting steps being carried out a temperature of less than about 160° C.

70. The process of claim 69, wherein said antisolvent comprises $CO_2$.

71. The process of claim 69, said contacting step being carried out at a temperature which is greater than the critical temperature of the antisolvent and less than the critical temperature of the solvent.

72. The process of claim 69, wherein said pressure is from about 1000–5000 psi.

* * * * *